(12) United States Patent
Parks

(10) Patent No.: US 10,269,847 B2
(45) Date of Patent: Apr. 23, 2019

(54) METHODS OF FORMING IMAGING PIXEL MICROLENSES

(71) Applicant: SEMICONDUCTOR COMPONENTS INDUSTRIES, LLC, Phoenix, AZ (US)

(72) Inventor: Christopher Parks, Pittsford, NY (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 40 days.

(21) Appl. No.: 15/174,676

(22) Filed: Jun. 6, 2016

(65) Prior Publication Data

US 2017/0250218 A1   Aug. 31, 2017

Related U.S. Application Data

(60) Provisional application No. 62/299,628, filed on Feb. 25, 2016.

(51) Int. Cl.
*H01L 27/146* (2006.01)
*H01L 31/0232* (2014.01)
*H01L 31/0216* (2014.01)

(52) U.S. Cl.
CPC .... *H01L 27/14627* (2013.01); *H01L 27/1462* (2013.01); *H01L 27/14625* (2013.01); *H01L 27/14685* (2013.01); *H01L 27/14689* (2013.01); *H01L 31/02162* (2013.01); *H01L 31/02327* (2013.01)

(58) Field of Classification Search
CPC .......... H01L 27/1462; H01L 27/14627; H01L 31/02162; H01L 31/02327
See application file for complete search history.

(56) References Cited

U.S. PATENT DOCUMENTS

| | | | |
|---|---|---|---|
| 5,672,519 A * | 9/1997 | Song ................... | H01L 27/1462 216/26 |
| 7,218,452 B2 | 5/2007 | Boettiger et al. | |
| 7,723,151 B2 * | 5/2010 | Lee ................... | H01L 27/14685 257/E21.249 |
| 7,785,909 B2 * | 8/2010 | Ryu ................. | B29D 11/00365 257/432 |
| 8,379,311 B2 * | 2/2013 | Yun ................. | B29D 11/00365 216/41 |
| 8,710,563 B2 * | 4/2014 | Yun ................... | H01L 27/14621 257/233 |
| 8,766,158 B2 * | 7/2014 | Arase ................... | G02B 3/0012 250/208.1 |
| 9,110,210 B2 * | 8/2015 | Maeda ............. | H01L 27/14627 |

(Continued)

*Primary Examiner* — Bac H Au
(74) *Attorney, Agent, or Firm* — Treyz Law Group, P.C.; Joseph F. Guihan

(57) ABSTRACT

A method of forming a microlens may include using two layers of photoresist. The first photoresist layer may be patterned to form a first portion of a pixel microlens. A second photoresist layer may be patterned on top of the first portion of the pixel microlens. The second photoresist may then be melted so that the second photoresist layer has a curved upper surface. The first and second photoresist layers may combine to form the pixel microlens. The indices of refraction of the first and second photoresist layers may the same or different. The melting point of the second photoresist may be lower than the melting point of the first photoresist.

13 Claims, 10 Drawing Sheets

(56) References Cited

U.S. PATENT DOCUMENTS

| | | | |
|---|---|---|---|
| 9,293,504 B2* | 3/2016 | Ootsuka | H01L 27/14621 |
| 9,601,534 B2* | 3/2017 | Sekine | H01L 27/14627 |
| 2004/0147059 A1* | 7/2004 | Jeong | H01L 27/14627 438/70 |
| 2005/0242271 A1* | 11/2005 | Weng | H01L 27/14621 250/214.1 |
| 2006/0027734 A1 | 2/2006 | Li et al. | |
| 2008/0007839 A1* | 1/2008 | Deng | G02B 3/0018 359/642 |
| 2008/0111204 A1* | 5/2008 | Yun | H01L 27/14627 257/432 |
| 2009/0225435 A1* | 9/2009 | Boettiger | B29D 11/00365 359/652 |
| 2015/0123227 A1* | 5/2015 | Ootsuka | G02B 1/11 257/432 |

* cited by examiner

METHODS OF FORMING IMAGING PIXEL MICROLENSES

CROSS-REFERENCE TO RELATED APPLICATION(S)

This application claims priority to U.S. Provisional Application No. 62/299,628, filed on Feb. 25, 2016, entitled "IMPROVED METHODS OF FORMING IMAGING PIXEL MICROLENSES," invented by Christopher Parks, and is incorporated herein by reference and priority thereto for common subject matter is hereby claimed.

BACKGROUND

This relates generally to imaging systems and, more particularly, to imaging systems that have pixels with microlenses.

Modern electronic devices such as cellular telephones, cameras, and computers often use digital image sensors. Imager sensors (sometimes referred to as imagers) may be formed from a two-dimensional array of image sensing pixels. Each pixel includes a photosensitive layer that receives incident photons (light) and converts the photons into electrical charge. Image sensors are sometimes designed to provide images to electronic devices using a Joint Photographic Experts Group (JPEG) format.

Each pixel in an image sensor may be covered by a microlens to focus light onto the pixel. Conventional microlenses may be formed using photolithography, where a photoresist is patterned into the desired microlens shape using light. However, photolithography may only be able to precisely pattern thin photoresist layers. Therefore, photolithography may not be a suitable method to form microlenses for large pixels, where the microlenses have greater thicknesses.

It would therefore be desirable to provide improved methods of forming pixel microlenses.

DETAILED DESCRIPTION

Figure 1:
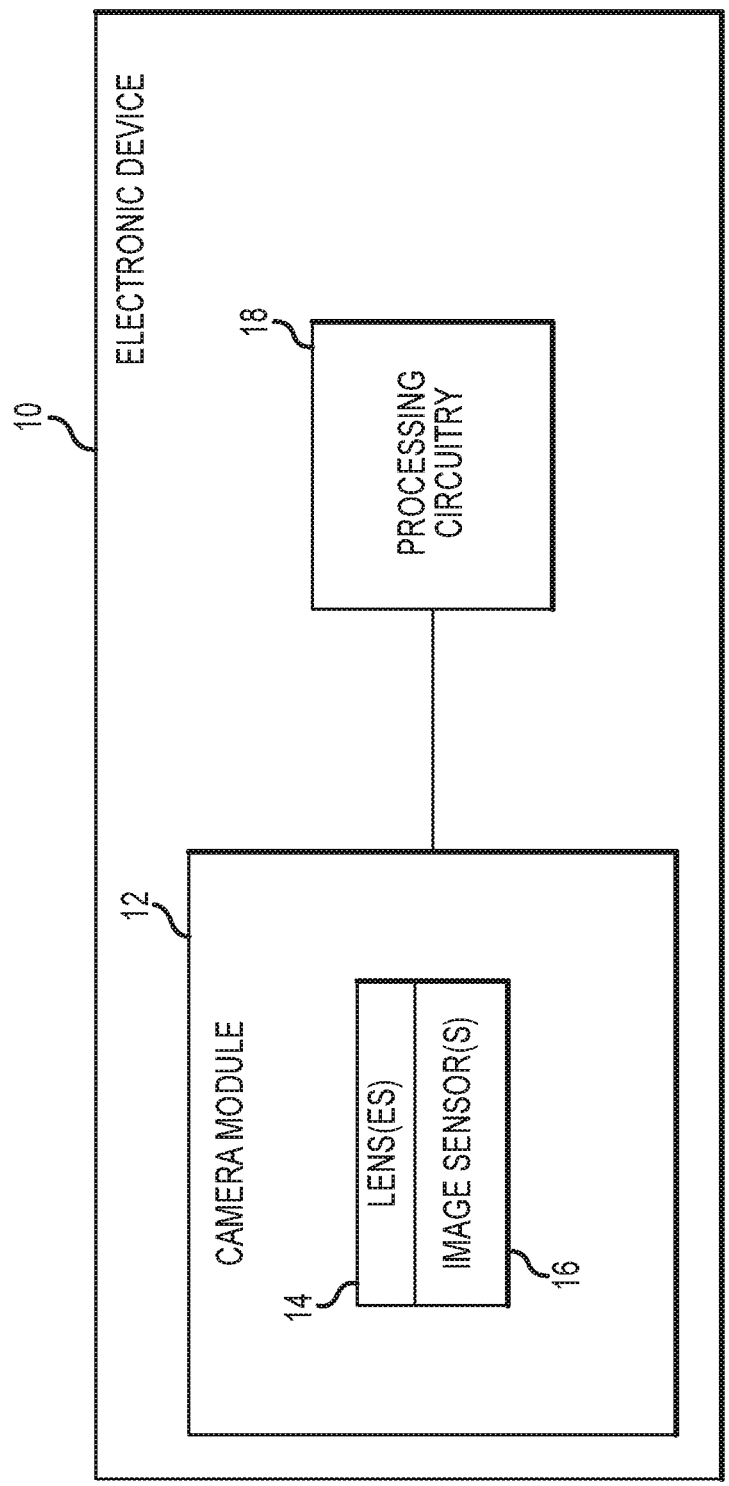
FIG. 1 is a schematic diagram of an illustrative electronic device that may include an image sensor in accordance with an embodiment of the present invention.

Embodiments of the present invention relate to image sensors with pixels that have microlenses. An illustrative electronic device that may include pixels with microlenses is shown in FIG. 1. Electronic device 10 may be a digital camera, a computer, a cellular telephone, a medical device, or other electronic device. Camera module 12 (sometimes referred to as an imaging device) may include image sensor 16 and one or more lenses 14. During operation, lenses 14 focus light onto image sensor 16. Image sensor 16 includes photosensitive elements (e.g., pixels) that convert the light into digital data. Image sensors may have any number of pixels (e.g., hundreds, thousands, millions, or more). A typical image sensor may, for example, have millions of pixels (e.g., megapixels). As examples, image sensor 16 may include bias circuitry (e.g., source follower load circuits), sample and hold circuitry, correlated double sampling (CDS) circuitry, amplifier circuitry, analog-to-digital (ADC) converter circuitry, data output circuitry, memory (e.g., buffer circuitry), address circuitry, etc.

Still and video image data from image sensor 16 may be provided to processing circuitry 18. Processing circuitry 18 may be used to perform image processing functions such as automatic focusing functions, depth sensing, data formatting, adjusting white balance and exposure, implementing video image stabilization, face detection, etc.

Processing circuitry 18 may also be used to compress raw camera image files if desired (e.g., to Joint Photographic Experts Group or JPEG format). In a typical arrangement, which is sometimes referred to as a system on chip (SOC) arrangement, image sensor 16 and processing circuitry 18 are implemented on a common integrated circuit. The use of a single integrated circuit to implement image sensor 16 and processing circuitry 18 can help to reduce costs. This is, however, merely illustrative. If desired, image sensor 16 and processing circuitry 18 may be implemented using separate integrated circuits. Processing circuitry 18 may include microprocessors, microcontrollers, digital signal processors, application specific integrated circuits, or other processing circuits.

Figure 2:
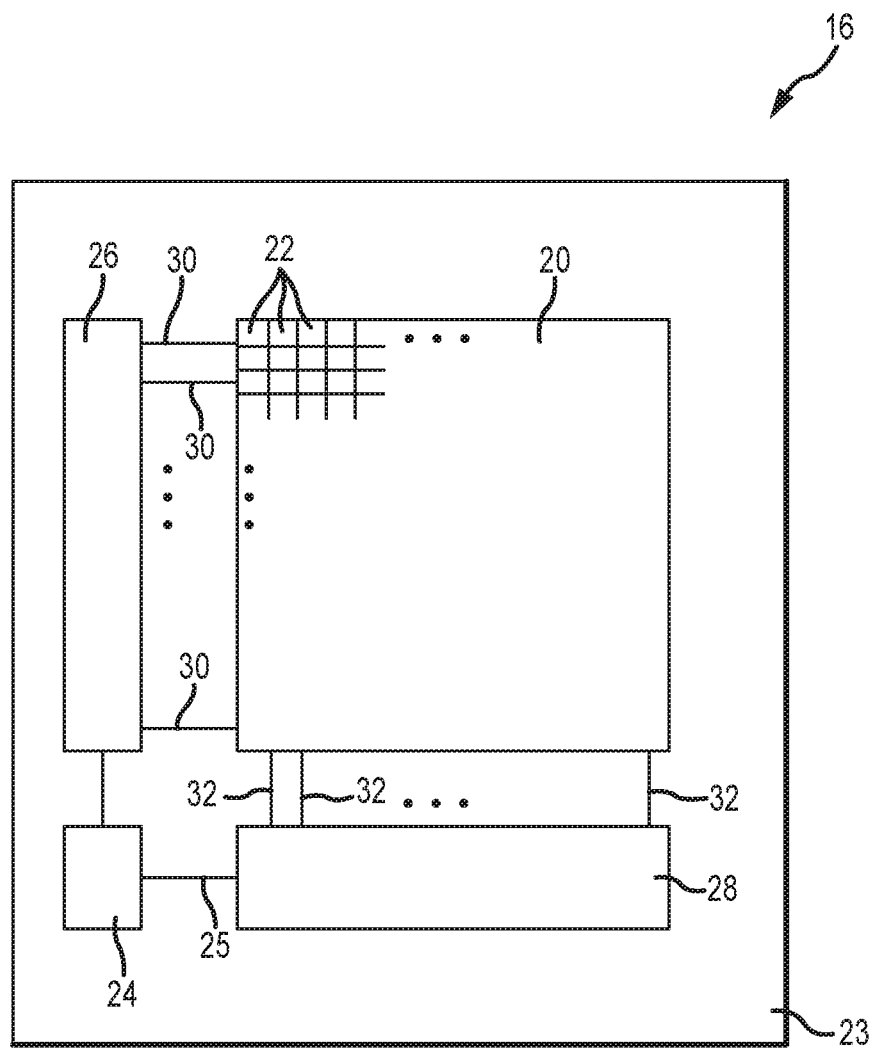
FIG. 2 is a diagram of an illustrative pixel array and associated readout circuitry for reading out image signals from the pixel array in accordance with an embodiment of the present invention.

As shown in FIG. 2, image sensor 16 may include pixel array 20 containing image sensor pixels 22 arranged in rows and columns (sometimes referred to herein as image pixels or pixels) and control and processing circuitry 24 (which may include, for example, image signal processing circuitry). Array 20 may contain, for example, hundreds or thousands of rows and columns of image sensor pixels 22. Control circuitry 24 may be coupled to row control circuitry 26 and image readout circuitry 28 (sometimes referred to as column control circuitry, readout circuitry, processing circuitry, or column decoder circuitry).

Row control circuitry 26 may receive row addresses from control circuitry 24 and supply corresponding row control signals such as reset, row-select, charge transfer, dual conversion gain, and readout control signals to pixels 22 over row control paths 30. One or more conductive lines such as column lines 32 may be coupled to each column of pixels 22 in array 20. Column lines 32 may be used for reading out image signals from pixels 22 and for supplying bias signals (e.g., bias currents or bias voltages) to pixels 22. If desired, during pixel readout operations, a pixel row in array 20 may be selected using row control circuitry 26 and image signals generated by image pixels 22 in that pixel row can be read out along column lines 32.

Image readout circuitry 28 may receive image signals (e.g., analog pixel values generated by pixels 22) over column lines 32. Image readout circuitry 28 may include sample-and-hold circuitry for sampling and temporarily storing image signals read out from array 20, amplifier circuitry, analog-to-digital conversion (ADC) circuitry, bias circuitry, column memory, latch circuitry for selectively enabling or disabling the column circuitry, or other circuitry that is coupled to one or more columns of pixels in array 20 for operating pixels 22 and for reading out image signals from pixels 22. ADC circuitry in readout circuitry 28 may convert analog pixel values received from array 20 into corresponding digital pixel values (sometimes referred to as digital image data or digital pixel data). Image readout circuitry 28 may supply digital pixel data to control and processing circuitry 24 and/or processor 18 (FIG. 1) over path 25 for pixels in one or more pixel columns.

Figure 3:
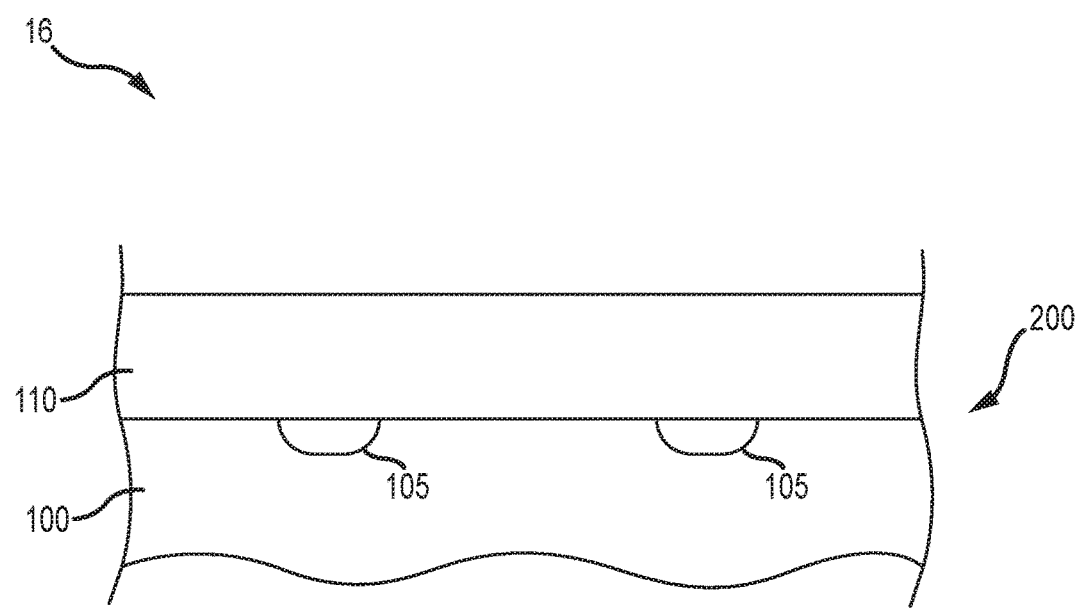
FIG. 3 is a cross-sectional side view of an illustrative image sensor with photosensitive areas formed in a substrate before microlens formation in accordance with an embodiment of the present invention.

FIG. 3 is a cross-sectional side view of an illustrative image sensor before microlens formation. At step 200, photosensitive areas 105 may be formed in substrate 100. Substrate 100 may be a doped semiconductor material such as silicon. For example, substrate 100 may be formed from p-type doped silicon. However, this example is merely illustrative and substrate 100 may be formed from any desired material. Photosensitive area 105 may be a photodiode, a pinned photodiode, a photocapacitor, or any other desired photon to electrical conversion element. In one illustrative example, photosensitive area 105 may be a pinned photodiode formed from n-type doped silicon. Photosensitive areas 105 may be used in either a complementary metal-oxide semiconductor (CMOS) pixel or a charge-coupled device (CCD) pixel.

Substrate 100 may be covered by layer 110. Layer 110 may be formed such that layer 110 directly covers and contacts substrate 100 and photosensitive areas 105. Layer 110 may include a color filter material, a dielectric passivation layer, polysilicon gates, metal gates, or metal wires. Layer 110 may include multiple layers (e.g., a color filter layer formed on a dielectric passivation layer). However, layer 110 has been illustrated as one layer in FIG. 3 for simplicity. In embodiments where image sensor 16 is a front-side illuminated image sensor, layer 110 may include a dielectric layer with metal signal lines. A color filter layer may also be formed on the dielectric layer with the metal signal lines. In embodiments where image sensor 16 is a back-side illuminated image sensor, metal signal lines may be formed below photosensitive areas 105.

Figure 4:
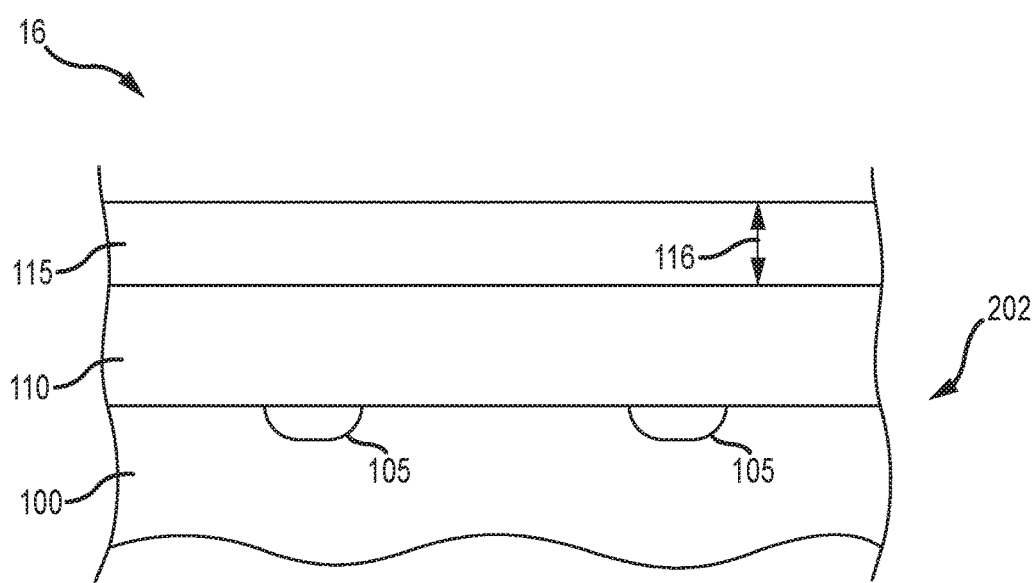
FIG. 4 is a cross-sectional side view of an illustrative image sensor with a first layer of photoresist in accordance with an embodiment of the present invention.

At step 202 in FIG. 4, a photoresist material may be formed over layers 110 and substrate 100 with photosensitive areas 105. Photoresist 115 may later be used to form a portion of a microlens for the pixels. Photoresist 115 may be formed over layer 110 using any desired method (e.g., photoresist may be sprayed, coated, deposited, etc.). As shown in FIG. 4, photoresist material 115 may have a thickness 116. Thickness 116 may be approximately 2 microns, approximately 1 micron, less than 2 microns, less than 1 micron, greater than 0.1 microns, less than 0.1 microns, between 0.1 and 2 microns, or any other desired thickness. Thickness 116 may be small enough for photoresist 115 to undergo precise photolithography.

At step 204, photoresist may undergo photolithography to form first microlens portions 118. First, the image sensor may be coated with a photoresist layer. The photoresist layer may be either a positive photoresist or a negative photoresist. A masking layer may be used to selectively expose portions of the photoresist to light. The masking layer may be a halftone mask. The example of a masking layer being used to selectively expose portions of the photoresist to light is merely illustrative, and other methods of selectively exposing portions of the photoresist to light may be used if desired. In embodiments where a positive photoresist is used, light may be selectively applied to the portions of the photoresist in between the imaging pixels (e.g., region 122) to form curved surfaces of the microlenses. The central portions of the imaging pixels (e.g., regions 120) may be completely covered by the mask to prevent these portions of the photoresist from being exposed to light. The photoresist may then be exposed to a photoresist developer. The portion that was exposed to light (region 122) may be soluble when exposed to the developer. The masked portion may remain insoluble when exposed to the developer.

In other embodiments, a negative photoresist may be used to coat the image sensor. In these embodiments, the central portions 120 of the imaging pixels may be completely exposed to light, while region 122 may be selectively masked from the light by a masking layer. When light is applied to the photoresist, the negative photoresist may become insoluble to the photoresist developer. Therefore, the photoresist in region 120 will be unchanged while the photoresist in region 122 will be patterned into curved surfaces for the microlenses. The photoresist may be exposed to any desired type of light (e.g., ultraviolet light, visible light, infrared light, etc.), and the mask may be formed from any desired material.

Figure 5:
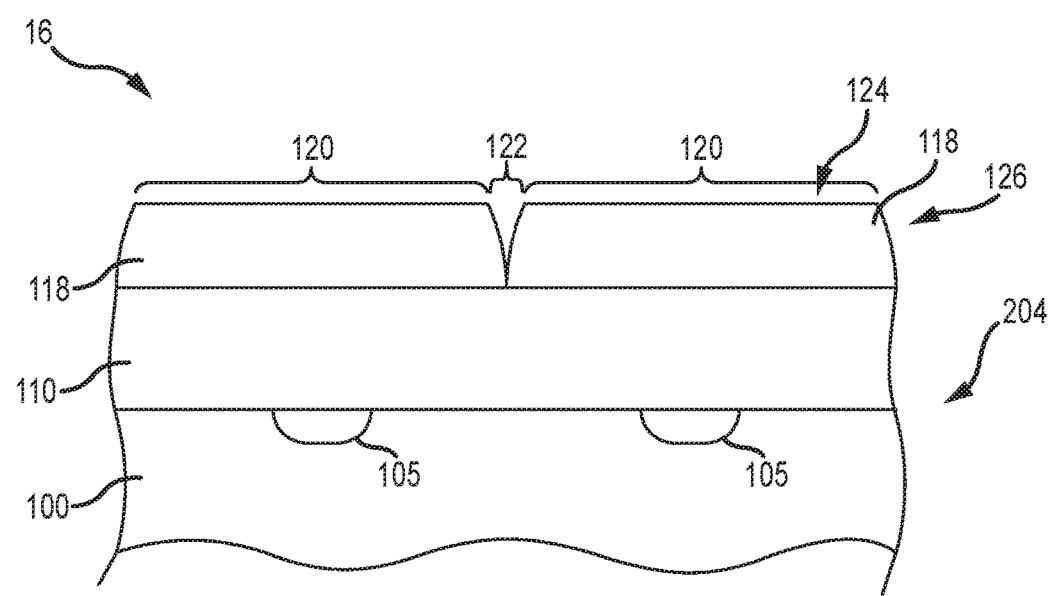
FIG. 5 is a cross-sectional side view of an illustrative image sensor with a layer of photoresist that has been patterned to form first portions of microlenses in accordance with an embodiment of the present invention.

As shown in FIG. 5, after photolithography the first microlens portions 118 may have a top surface 124 and curved side surfaces 126. Top surface 124 (which may sometimes be referred to as a pedestal or a pedestal surface) may be a planar or substantially planar surface if desired. The curved side surfaces 126 may be precisely curved such that incident light that passes through side surfaces 126 will be focused on photosensitive areas 105.

Figure 6:
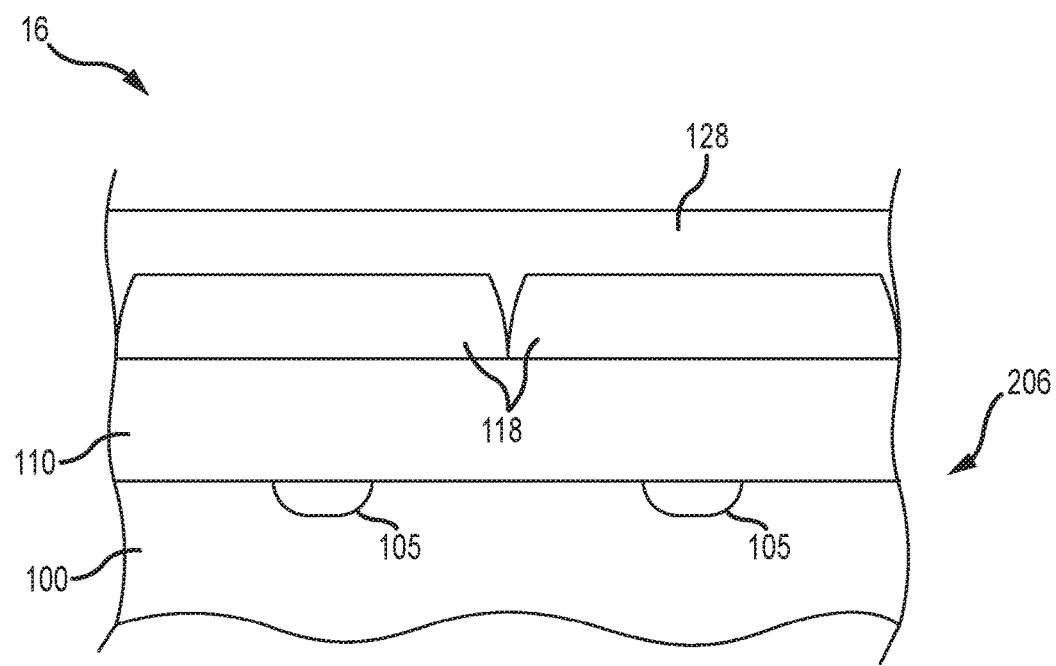
FIG. 6 is a cross-sectional side view of an illustrative image sensor with a second layer of photoresist formed over first microlens portions in accordance with an embodiment of the present invention.
Figure 7:
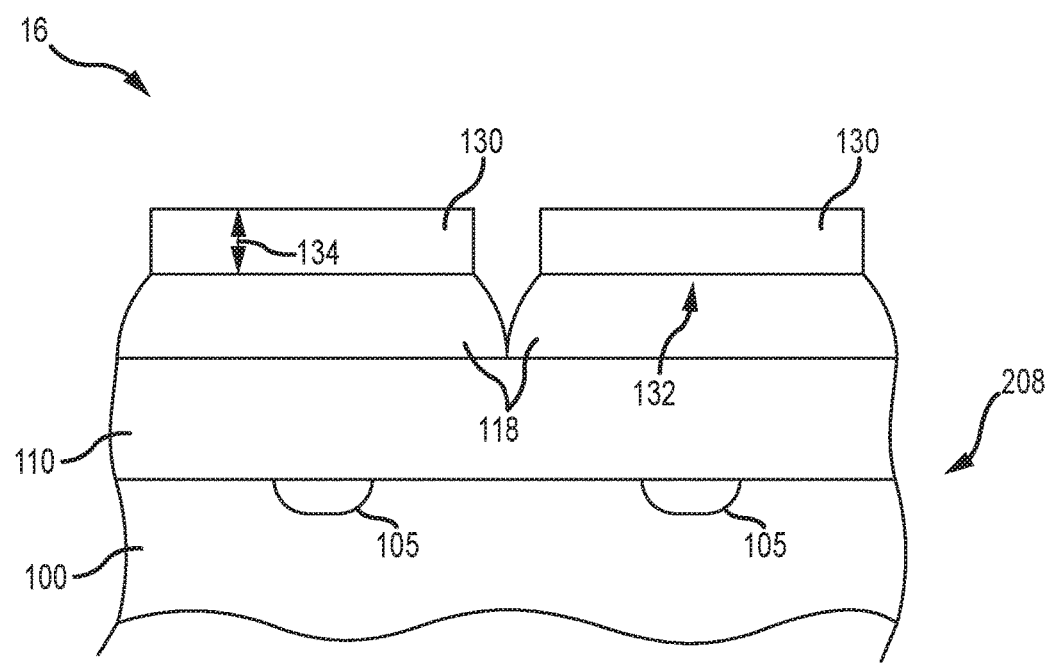
FIG. 7 is a cross-sectional side view of an illustrative image sensor after the second layer of photoresist has been patterned in accordance with an embodiment of the present invention.

At step 206 in FIG. 6, additional photoresist material 128 may be formed over the first microlens portions 118 (which are formed from photoresist 115). The additional photoresist material may then undergo photolithography to form patterned photoresist portions 130, as shown in step 208 of FIG. 7. Photoresist 128 may be a positive photoresist or a negative resist, as described in connection with FIG. 5 above. The patterned photoresist portions 130 may have the same shape as the top surface of microlens portions 118. For example, if microlens portion 118 is circular with a circular upper surface 124, each photoresist portion 130 may be a cylinder with a bottom surface 132 that matches the area and shape of upper surface 124. Photoresist portions 130 may have a thickness 134 of approximately 2 microns, greater than 2 microns, approximately 1 micron, less than 2 microns, less than 1 micron, greater than 0.1 microns, less than 0.1 microns, between 0.1 and 2 microns, or any other desired thickness.

At step 210, patterned photoresist portions 130 may undergo a reflow process. The reflow process may heat the photoresist 130 past its melting point such that the photoresist transitions from a solid to a liquid. After being melted, photoresist portions 130 may form a spherical cap that forms second portions 136 of the microlenses. The surface tension of the melted photoresist will ensure that the photoresist does not flow off of pedestal surface 124 and instead forms curved second microlens portions 136. The second microlens portion 136 and first microlens portion 118 may combine to form microlenses 138. Microlenses 138 may have a thickness 140. Thickness 140 may be less than 10 microns, less than 6 microns, less than 4 microns, approximately 4 microns, between 3 and 5 microns, less than 2 microns, approximately 2 microns, or greater than 2 microns. Thickness 140 of microlens 138 may be greater than a thickness that could be achieved through photolithography alone.

The first and second portions of microlens 138 (118 and 136 respectively) may have the same indices of refraction or different indices of refraction. The second portion 136 of the microlens 138 may have a lower melting point than the first portion 118 of the microlens. This ensures that during reflow of photoresist 130 to form microlens portion 136, the first microlens portion 118 does not also melt and maintains its structural integrity. Additionally, after being patterned, the first microlens portion 118 may be exposed to heat, light, or other energy in a curing process. The curing process may help ensure that layer 118 does not melt during the reflow process.

The microlenses formed using a combination of photolithography and reflow may have any desired shape. For example, the microlenses may be formed with a circular shape or an elliptical shape. If desired, different microlenses in the same image sensor may have different shapes. For example, some of the microlenses may be formed with circular shapes while some of the microlenses may be formed with elliptical shapes.

Figure 8:
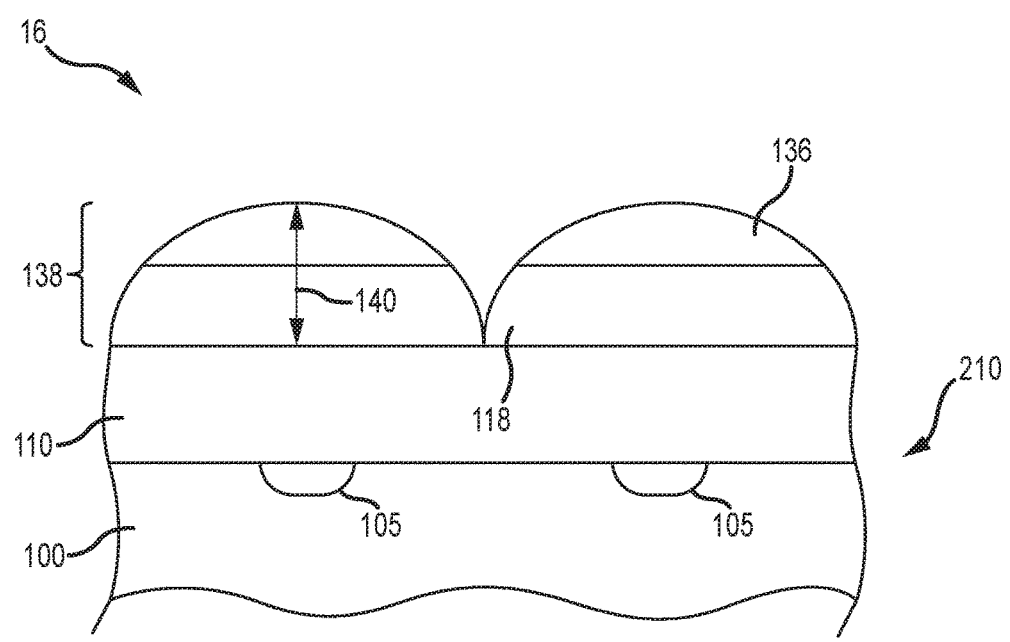
FIG. 8 is a cross-sectional side view of an illustrative image sensor after the second layer of photoresist has been melted to form second portions of microlenses in accordance with an embodiment of the present invention.
Figure 9:
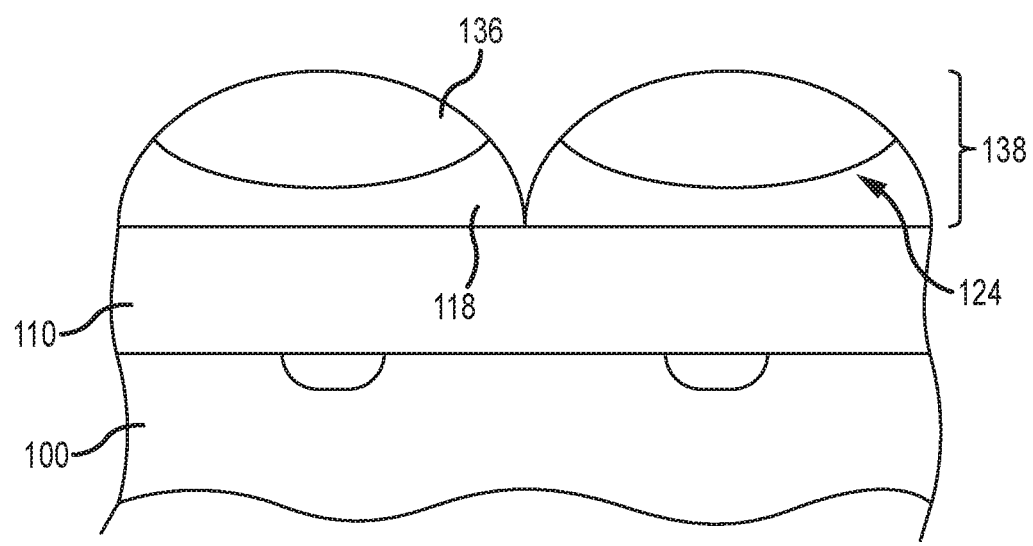
FIG. 9 is a cross-sectional side view of an illustrative image sensor with photoresist layer with two curved surfaces in accordance with an embodiment of the present invention.

As shown in FIG. 9, upper surface 124 of photoresist layer 118 may not be planar. Photoresist layer 118 may be formed with a curved upper surface during photolithography. Later, when layer 136 is formed via reflow, the melted photoresist may be conform to the curved surface. This type of curved surface may form a biconvex lens shape instead of the plano-convex lens shape of FIG. 8.

Figure 10:
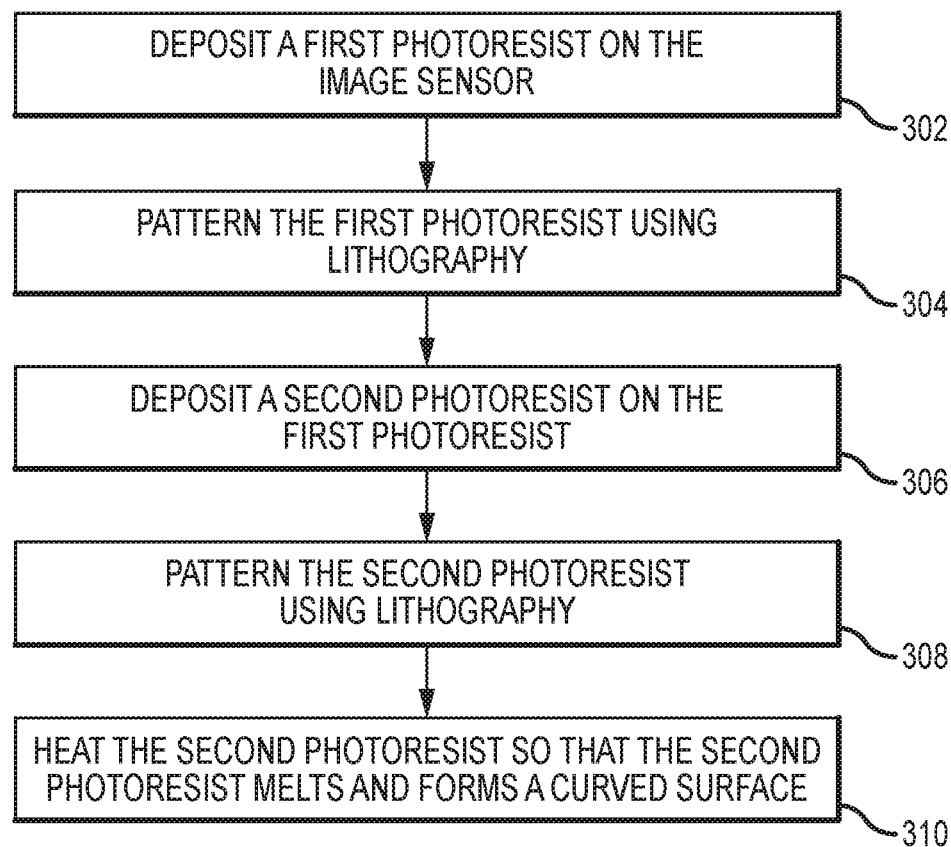
FIG. 10 a flowchart of illustrative steps for forming a microlens in accordance with an embodiment of the present invention.

FIG. 10 is a flowchart of illustrative steps for forming a microlens. At step 302, a first photoresist may be deposited on the image sensor. The first photoresist may be a positive photoresist or a negative photoresist, and the first photoresist may have any desired thickness. Next, the first photoresist may be patterned at step 304 using lithography. The first photoresist may be exposed to light through a halftone mask during patterning. The patterned first photoresist may form a first portion of the microlens. The patterned first photoresist may have a planar upper surface or a non-planar upper surface.

At step 306, a second photoresist may be deposited on the first photoresist. The second photoresist may coat the entire image sensor. The second photoresist may be a positive photoresist or a negative photoresist. The second photoresist may then be patterned at step 308 using lithography. The second photoresist may be exposed to light through a halftone mask during patterning. The patterned second photoresist may form disks on the upper surface of the patterned first photoresist. The second photoresist may have a planar upper surface after patterning.

At step 310, the second photoresist may be heated such that the second photoresist melts. After melting, the patterned second photoresist may have a curved upper surface. The second photoresist may form a second portion of the microlens.

In various embodiments of the present invention, a method of forming a microlens may include, patterning a first photoresist to form a first portion of the microlens, forming a second photoresist on the first portion of the microlens, and heating the second photoresist so that the second photoresist melts and forms a second portion of the microlens. The method may also include forming the first photoresist on a substrate before patterning the first photoresist. Patterning the first photoresist may include selectively exposing the first photoresist to light through a masking layer. Forming the second photoresist may include forming the second photoresist on the first photoresist. The method may also include patterning the second photoresist after forming the second photoresist on the first photoresist. Patterning the second photoresist may include selectively exposing the second photoresist to light.

The first photoresist may have a first index of refraction and the second photoresist may have a second index of refraction. The first index of refraction may be different than the second index of refraction. The first index of refraction may be the same as the second index of refraction. The first photoresist may have a first melting point. The second photoresist may have a second melting point. The first melting point may be higher than the second melting point. The first portion of the microlens may have a planar upper surface and curved side surfaces. The second portion of the microlens may have a planar lower surface and a curved upper surface. The microlens may have a thickness greater than two microns.

In various embodiments, a method may include forming a first photoresist layer over an image sensor, patterning the first photoresist layer so that there are a plurality of patterned first photoresist portions, forming a second photoresist layer over the first photoresist layer, patterning the second photoresist layer so that there are a plurality of patterned second photoresist portions, and heating the plurality of patterned second photoresist portions so that the patterned second photoresist portions melt. The image sensor may have a plurality of photosensitive areas. Each patterned first photoresist portion may cover a respective photosensitive area. Each patterned second photoresist portion may cover a respective patterned first photoresist portion. Each of the melted patterned second photoresist portions may have a curved upper surface. The first photoresist layer may have a first melting point, the second photoresist layer may have a second melting point, and the second melting point may be lower than the first melting point. Patterning the first photoresist layer so that there are a plurality of patterned first photoresist portions may include patterning the first photoresist layer using photolithography.

In various embodiments, A method of forming a microlens over an imaging pixel may include using photolithography to pattern a first photoresist to form a first portion of the microlens, using photolithography to pattern a second photoresist to form a patterned photoresist portion on the upper surface of the first portion of the microlens, and exposing the patterned photoresist portion to heat so that the patterned photoresist portion melts and forms a curved upper surface. The first portion of the microlens may have an upper surface, and the patterned photoresist portion may have a planar upper surface. Exposing the patterned photoresist portion to heat so that the patterned photoresist portion melts and forms the curved upper surface may include exposing the patterned photoresist portion to heat so that the patterned photoresist portion melts and forms a second portion of the microlens. The upper surface of the first portion of the microlens may be planar or non-planar. The non-planar upper surface of the first portion of the microlens may form a portion of a biconvex lens.

The foregoing is merely illustrative of the principles of this invention and various modifications can be made by those skilled in the art without departing from the scope and spirit of the invention.

What is claimed is:

1. A method of forming a microlens, the method comprising:
    patterning a first photoresist to form a first portion of the microlens, wherein the first portion of the microlens has a concave curved upper surface;
    forming a second photoresist on the first portion of the microlens, wherein the second photoresist has a melting point; and
    reflowing the second photoresist so that the second photoresist forms a second portion of the microlens, wherein reflowing the second photoresist comprises heating the second photoresist past the melting point and wherein the second portion of the microlens has a convex curved upper surface and a convex curved lower surface that is adjacent to the concave curved upper surface of the first portion of the microlens.

2. The method defined in claim 1, further comprising:
    before patterning the first photoresist, forming the first photoresist on a substrate.

3. The method defined in claim 1, further comprising:
    after forming the second photoresist on the first portion of the microlens, patterning the second photoresist.

4. The method defined in claim 3, wherein patterning the second photoresist comprises selectively exposing the second photoresist to light.

5. The method defined in claim 1, wherein the first photoresist has a first index of refraction, wherein the second photoresist has a second index of refraction, and wherein the first index of refraction is different than the second index of refraction.

6. The method defined in claim 1, wherein the first photoresist has a first index of refraction, wherein the second photoresist has a second index of refraction, and wherein the first index of refraction is the same as the second index of refraction.

7. The method defined in claim 1, wherein the melting point is a second melting point, wherein the first photoresist has a first melting point, and wherein the first melting point is higher than the second melting point.

8. The method defined in claim 1, wherein the first portion of the microlens has curved side surfaces.

9. The method defined in claim 1, wherein the microlens has a thickness greater than two microns.

10. A method comprising:
    forming a first photoresist layer over an image sensor, wherein the image sensor has a plurality of photosensitive areas;
    patterning the first photoresist layer so that there are a plurality of patterned first photoresist portions, wherein each patterned first photoresist portion covers a respective photosensitive area and has a respective non-planar upper surface and wherein the respective non-planar upper surface of each patterned first photoresist portion is a respective concave curved upper surface;
    forming a second photoresist layer over the first photoresist layer, wherein the second photoresist layer has a melting point;
    patterning the second photoresist layer so that there are a plurality of patterned second photoresist portions, wherein each patterned second photoresist portion covers a respective patterned first photoresist portion; and
    heating the plurality of patterned second photoresist portions past the melting point so that the patterned second photoresist portions melt, wherein each of the melted patterned second photoresist portions has a respective convex curved upper surface and a respective convex curved lower surface adjacent to the respective concave curved upper surface of its respective patterned first photoresist portion.

11. The method defined in claim 10, wherein the melting point is a second melting point, wherein the first photoresist layer has a first melting point, and wherein the second melting point is lower than the first melting point.

12. A method of forming a microlens over an imaging pixel, the method comprising:
    using photolithography to pattern a first photoresist to form a first portion of the microlens, wherein the first portion of the microlens has an upper surface and wherein the upper surface of the first portion of the microlens is concave;
    using photolithography to pattern a second photoresist to form a patterned photoresist portion on the upper surface of the first portion of the microlens, wherein the patterned photoresist portion has a planar upper surface; and
    reflowing the patterned photoresist portion by exposing the patterned photoresist portion to heat so that the patterned photoresist portion forms a second portion of the microlens having a convex curved upper surface, wherein the second portion of the microlens has a convex curved lower surface adjacent to the concave upper surface of the first portion of the microlens.

13. The method defined in claim 12, wherein reflowing the patterned photoresist portion by exposing the patterned photoresist portion to heat so that the patterned photoresist portion forms the curved upper surface comprises exposing the patterned photoresist portion to heat so that the patterned photoresist portion transitions from a solid to a liquid.

* * * * *